United States Patent
Kobayashi et al.

(10) Patent No.: US 9,614,488 B2
(45) Date of Patent: Apr. 4, 2017

(54) INFORMATION PROCESSING APPARATUS, METHOD FOR PROCESSING INFORMATION, AND PROGRAM

(71) Applicant: SONY CORPORATION, Tokyo (JP)

(72) Inventors: Takashi Kobayashi, Tokyo (JP); Tomohiro Katori, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/663,834

(22) Filed: Mar. 20, 2015

(65) Prior Publication Data
US 2015/0281837 A1 Oct. 1, 2015

(30) Foreign Application Priority Data
Mar. 28, 2014 (JP) .................................. 2014-067810

(51) Int. Cl.
H03G 3/34 (2006.01)

(52) U.S. Cl.
CPC .................................. *H03G 3/341* (2013.01)

(58) Field of Classification Search
None
See application file for complete search history.

(56) References Cited

U.S. PATENT DOCUMENTS

| | | | | |
|---|---|---|---|---|
| 6,138,091 A | * | 10/2000 | Haataja | H04M 1/656 704/215 |
| 2009/0017879 A1 | * | 1/2009 | Tsfaty | H04B 1/46 455/574 |
| 2011/0170713 A1 | * | 7/2011 | Sugihara | H03F 1/0233 381/107 |
| 2012/0195242 A1 | * | 8/2012 | Pyles | H04W 52/0251 370/311 |
| 2014/0003630 A1 | * | 1/2014 | Demiya | H03G 3/20 381/107 |
| 2014/0162555 A1 | * | 6/2014 | Wernaers | H04W 4/008 455/41.2 |
| 2015/0030184 A1 | * | 1/2015 | Yamada | H03F 1/025 381/120 |

\* cited by examiner

*Primary Examiner* — Paul Huber
(74) *Attorney, Agent, or Firm* — Chip Law Group (57) ABSTRACT

An information processing apparatus includes an audio processing unit that performs a predetermined process for an input audio signal, and a power saving control unit that allows the audio processing unit to transition into a power saving state, depending on the length of a silence section in the audio signal.

7 Claims, 8 Drawing Sheets

FIG. 2

| POWER SAVING STATE | LENGTH OF SILENCE SECTION |
|---|---|
| ST1 | GREATER THAN OR EQUAL TO 2 ms LESS THAN 30 ms |
| ST2 | GREATER THAN OR EQUAL TO 30 ms LESS THAN 340 ms |
| ST3 | GREATER THAN OR EQUAL TO 340 ms LESS THAN 600 ms |
| ST4 | GREATER THAN OR EQUAL TO 600 ms LESS THAN 1000 ms |
| ST5 | GREATER THAN OR EQUAL TO 1000 ms |

FIG. 3

| POWER SAVING STATE | STOPPED PART | RESTORATION TIME |
|---|---|---|
| ST1 | OSCILLATING UNIT | 1 ms |
| ST2 | OSCILLATING UNIT, SIGNAL CONTROL UNIT | 10 ms |
| ST3 | OSCILLATING UNIT, SIGNAL CONTROL UNIT, DSP UNIT | 50 ms |
| ST4 | OSCILLATING UNIT, SIGNAL CONTROL UNIT, DSP UNIT, DAC UNIT | 100 ms |
| ST5 | OSCILLATING UNIT, SIGNAL CONTROL UNIT, DSP UNIT, DAC UNIT, AMPLIFIER UNIT | 300 ms |

FIG. 7

INFORMATION PROCESSING APPARATUS, METHOD FOR PROCESSING INFORMATION, AND PROGRAM

CROSS REFERENCE TO RELATED APPLICATIONS

This application claims the benefit of Japanese Priority Patent Application JP 2014-067810 filed Mar. 28, 2014, the entire contents of which are incorporated herein by reference.

BACKGROUND

The present disclosure relates to an information processing apparatus, a method for processing information, and a program, and particularly to an information processing apparatus, a method for processing information, and a program in which a transition is made into a power saving state, depending on a silence section in an audio signal of a process target.

Saving power in electronic devices is desired in the related art. The problem is how to realize power saving particularly in battery-driven mobile devices represented by a smartphone and the like in order to extend the usable time thereof.

Various proposals are made to realize power saving in mobile devices so far. For example, a method is proposed with intention to realize power saving in a case where a mobile device as an audio player processes an audio signal (for example, refer to Japanese Unexamined Patent Application Publication No. 5-252121). The method detects a silence section in the audio signal and stops the operation of a part of circuits processing the audio signal in the silence section. When detecting a sound section thereafter, the method resumes the operation of the part of the circuits.

SUMMARY

The method in Japanese Unexamined Patent Application Publication No. 5-252121, however, does not consider a transition time and a restoration time. A transition time is a time necessary to stop the operation of the part of the circuits, and a restoration time is a time necessary to resume the operation. Thus, the problem is that only the operation of the circuits having a very short transition time and a restoration time can be stopped, and the effect of reducing the power consumption is achieved only when the length of the silence section is long enough.

It is desirable to realize power saving effectively by making a transition into a power saving state, depending on the length of a silence section in an audio signal.

According to an embodiment of the present disclosure, there is provided an information processing apparatus including an audio processing unit that performs a predetermined process for an input audio signal, and a power saving control unit that allows the audio processing unit to transition into a power saving state, depending on the length of a silence section in the audio signal.

The information processing apparatus in the embodiment of the present disclosure may further include a silence detecting unit that detects a silence section in the input audio signal and generates a power saving control signal including the detection result, in which the power saving control unit may allow the audio processing unit to transition into the power saving state according to the power saving control signal.

In the information processing apparatus, the silence detecting unit may generate the power saving control signal that includes the start time and the end time of the detected silence section.

In the information processing apparatus, the silence detecting unit may select the power saving state among a plurality of power saving states, depending on the length of the detected silence section and may generate the power saving control signal including the selection result.

In the information processing apparatus, the silence detecting unit may select, among a plurality of power saving states, the power saving state in which the amount of reduction in power is great as the length of the detected silence section is longer and may generate the power saving control signal including the selection result.

In the information processing apparatus, the power saving control unit may perform a transition process that allows the audio processing unit to transition into the power saving state from a normal state and a restoration process that restores the audio processing unit to the normal state from the power saving state during the silence section.

In the information processing apparatus, the silence detecting unit may select, among a plurality of power saving states, the power saving state in which a time necessary for the restoration process is long as the length of the detected silence section is longer and may generate the power saving control signal including the selection result.

According to another embodiment of the present disclosure, there is provided a method for processing information in an information processing apparatus that includes an audio processing unit performing a predetermined process for an input audio signal, the method including power saving controlling, by the information processing apparatus, that allows the audio processing unit to transition into a power saving state, depending on the length of a silence section in the audio signal.

According to still another embodiment of the present disclosure, there is provided a program that allows a computer to function as an audio processing unit that performs a predetermined process for an input audio signal, and a power saving control unit that allows the audio processing unit to transition into a power saving state, depending on the length of a silence section in the audio signal.

In the embodiment of the present disclosure, the audio processing unit transitions into the power saving state, depending on the length of the silence section in the audio signal.

According to the embodiments of the present disclosure, power saving can be effectively realized.

DETAILED DESCRIPTION OF EMBODIMENTS

Figure 1:
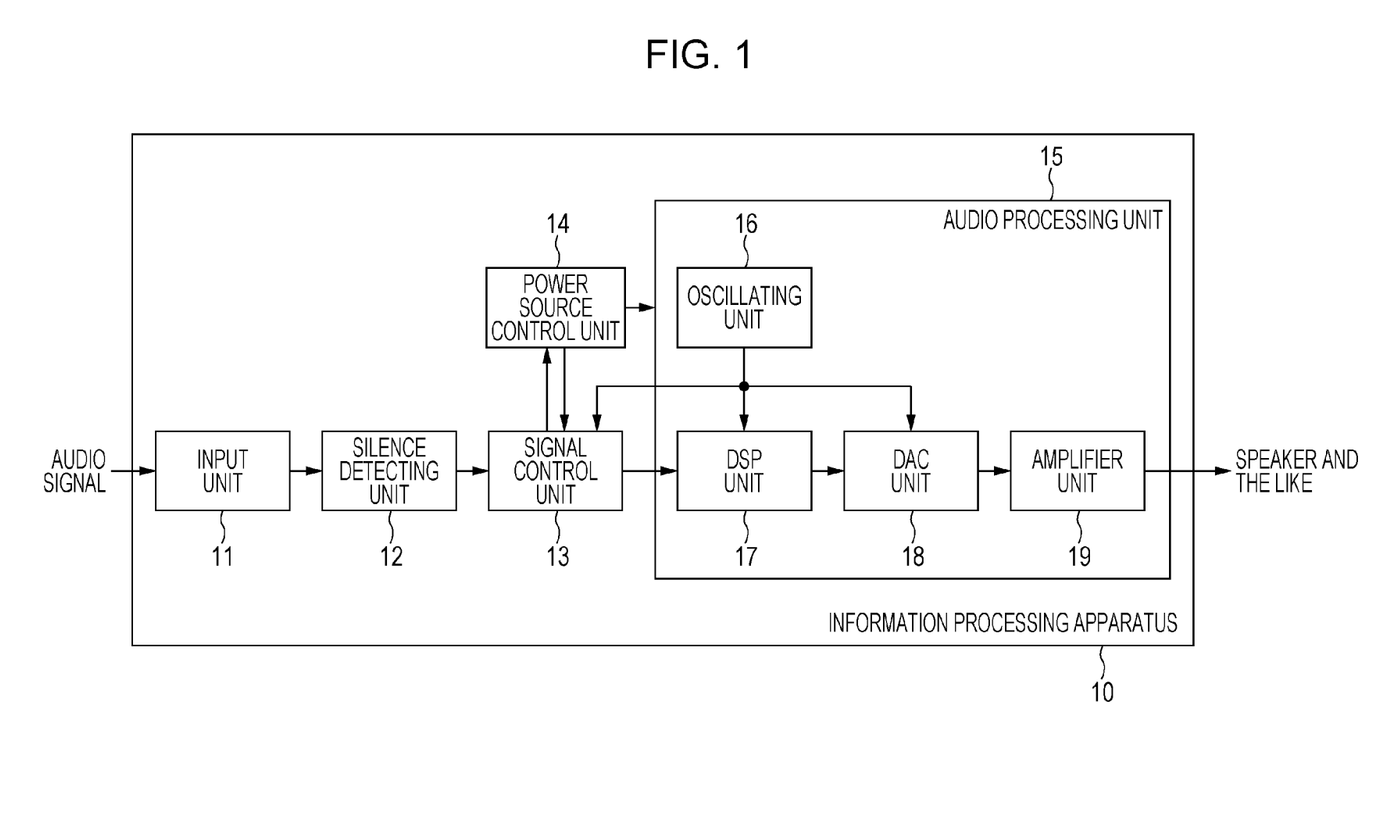
FIG. 1 is a block diagram illustrating a configuration example of an information processing apparatus to which an embodiment of the present disclosure is applied.

Hereinafter, an exemplary mode for embodying the present disclosure (referred to as an embodiment hereinafter) will be described in detail with reference to the drawings.
Configuration Example of Information Processing Apparatus FIG. 1 illustrates a configuration example of an information processing apparatus which is an embodiment of the present disclosure. An information processing apparatus 10 reproduces an audio signal that is input as a process target. The information processing apparatus 10 can be applied to, for example, an audio player. When detecting a silence section from an audio signal, the information processing apparatus 10 transitions into one of a plurality of prepared power saving states depending on the length of the silence section, thus reducing the power consumption and realizing power saving.

The information processing apparatus 10 includes an input unit 11, a silence detecting unit 12, a signal control unit 13, a power source control unit 14, and an audio processing unit 15.

The input unit 11 obtains an audio signal and supplies the audio signal to the silence detecting unit 12. The silence detecting unit 12 detects a silence section in the audio signal and selects a power saving state to transition by referring to information that is held by the silence detecting unit 12 and indicates the correspondence between the length of a silence section and a power saving state to transition. The silence detecting unit 12 further outputs a power saving control signal and the audio signal to the signal control unit 13. The power saving control signal includes the start time and the end time of the silence section and the selected power saving state.

Figure 2:
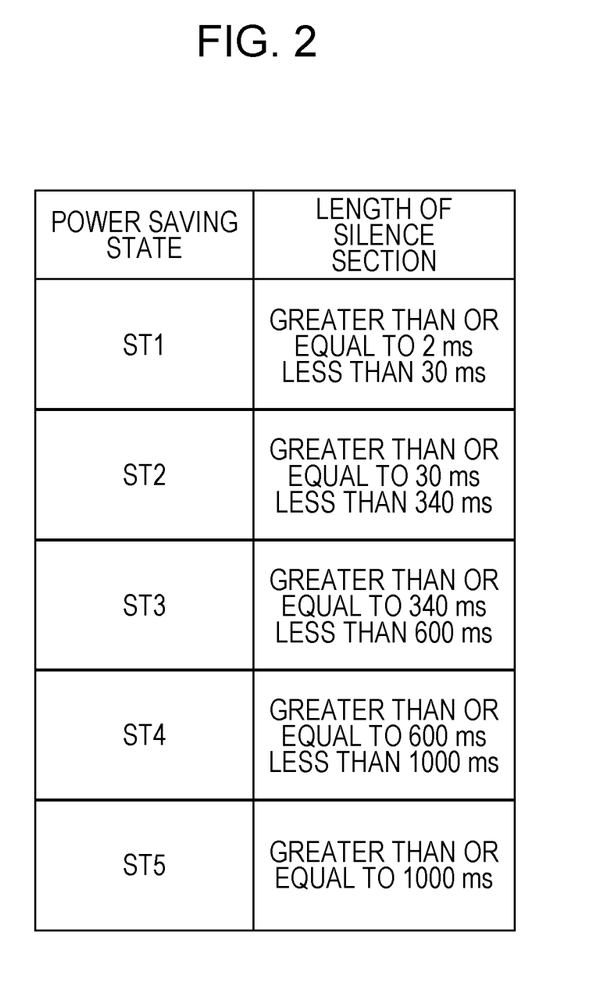
FIG. 2 is a diagram illustrating information that indicates the correspondence between the length of a silence section and a power saving state to transition.

FIG. 2 illustrates the information that is held in advance by the silence detecting unit 12 and indicates the correspondence between the length of a silence section and a power saving state to transition.

A power saving state ST1 is selected when the length of a silence section is greater than or equal to 2 milliseconds (ms) and less than 30 ms according to the information indicating the correspondence. A power saving state ST2 is selected when the length of a silence section is greater than or equal to 30 ms and less than 340 ms. The power consumption in the power saving state ST2 is less than that in the power saving state ST1. A power saving state ST3 is selected when the length of a silence section is greater than or equal to 340 ms and less than 600 ms. The power consumption in the power saving state ST3 is less than that in the power saving state ST2. A power saving state ST4 is selected when the length of a silence section is greater than or equal to 600 ms and less than 1000 ms. The power consumption in the power saving state ST4 is less than that in the power saving state ST3. A power saving state ST5 is selected when the length of a silence section is greater than or equal to 1000 ms. The power consumption in the power saving state ST5 is less than that in the power saving state ST4. When the length of a silence section is less than 2 ms, a power saving state is not selected because a transition is not made into a power saving state in this case. The number of power saving states is not limited to the five types of ST1 to ST5 and may be greater or less than five.

The start time of a silence section included in the power saving control signal is specified as a time when the outputting of an audio signal in a sound section that is present prior to the silence section is started from the audio processing unit 15 to a speaker and the like at a rear stage after the audio signal is input into the audio processing unit 15. The end time of a silence section is specified as a time obtained by adding the length of the time of the silence section to the start time.

FIG. 1 is referred to again. The signal control unit 13 outputs only an audio signal in a sound section to the audio processing unit 15 at a rear stage. That is to say, the signal control unit 13 stands by to output an audio signal during a silence section without outputting an audio signal corresponding to the silence section to the audio processing unit 15 at a rear stage. In addition, the signal control unit 13 outputs to the power source control unit 14 the power saving control signal that is input from the silence detecting unit 12.

The power source control unit 14 supplies drive power to each unit of the information processing apparatus 10. In addition, according to the power saving control signal input from the signal control unit 13, the power source control unit 14 controls each unit for a transition into a selected power saving state in a silence section by referring to power saving state information that the power source control unit 14 holds in advance. Specifically, the power source control unit 14 performs a transition process that limits the supply of power to units, among the configurational units of the information processing apparatus 10, that are to be stopped in a selected power saving state in order to stop the operation of the units. Thereafter, the power source control unit 14 performs a restoration process that resumes the operation of the units.

The audio processing unit 15 includes an oscillating unit 16, a DSP unit 17, a DAC unit 18, and an amplifier unit 19. The configuration of the audio processing unit 15, however, is not limited to this. The oscillating unit 16 generates a clock signal having a predetermined period and supplies the clock signal to the signal control unit 13, the DSP unit 17, and the DAC unit 18. This synchronizes the operation of the signal control unit 13, the DSP unit 17, and the DAC unit 18. The DSP unit 17 performs a decoding process for an audio signal and outputs a digital signal which is the result of the process to the DAC unit 18. The DAC unit 18 converts the digital signal, which is the result of the decoding process, into an analog signal and outputs the analog signal to the amplifier unit 19. The amplifier unit 19 amplifies the analog signal to an extent in which a speaker and the like at a rear stage may be driven.

Example of Power Saving State Information

Figure 3:
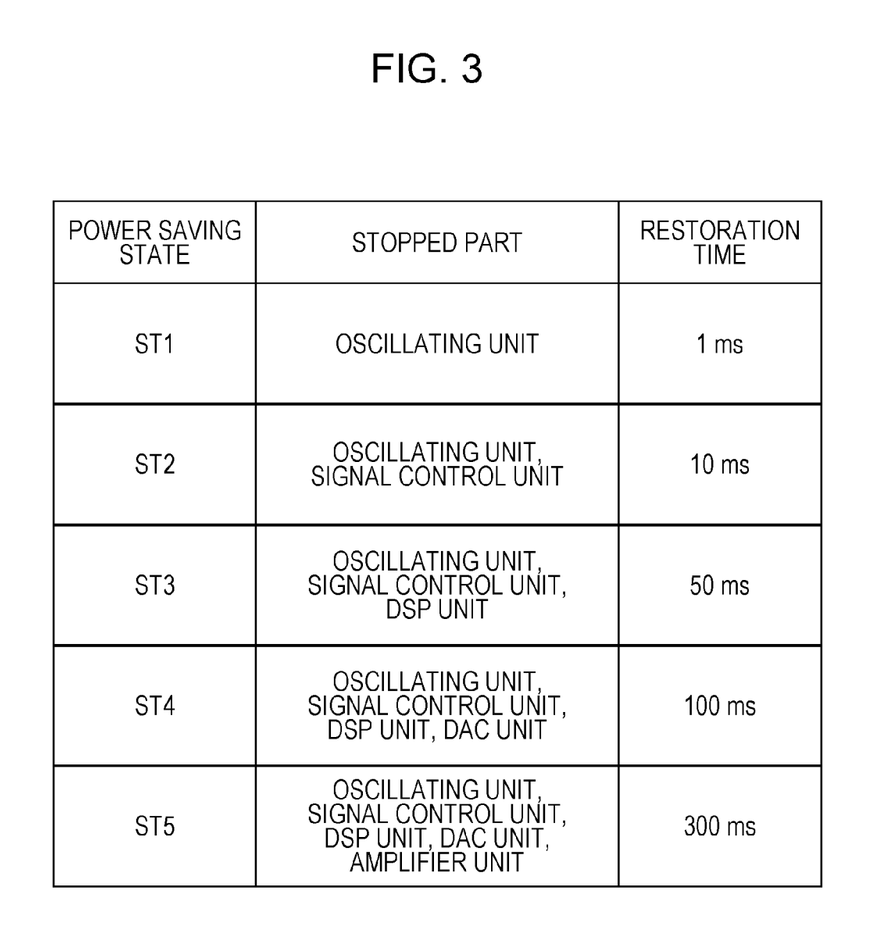
FIG. 3 is a diagram illustrating power saving state information.

Next, FIG. 3 illustrates an example of the power saving state information that the power source control unit 14 holds in advance.

The operation of the oscillating unit 16 is stopped in the power save state ST1 according to the power saving state information. The restoration time to a normal state (a state where the audio processing unit 15 can process a sound section in an audio signal) from the power saving state ST1 is 1 ms. The operation of the oscillating unit 16 and the signal control unit 13 is stopped in the power saving state ST2. The restoration time to the normal state from the power saving state ST2 is 10 ms. The operation of the oscillating unit 16, the signal control unit 13, and the DSP unit 17 is stopped in the power saving state ST3. The restoration time to the normal state from the power saving state ST3 is 50 ms. The operation of the oscillating unit 16, the signal control unit 13, the DSP unit 17, and the DAC unit 18 is stopped in the power saving state ST4. The restoration time to the normal state from the power saving state ST4 is 100 ms. The operation of the oscillating unit 16, the signal control unit 13, the DSP unit 17, the DAC unit 18, and the amplifier unit 19 is stopped in the power saving state ST5. The restoration time to the normal state from the power saving state ST5 is 300 ms.

Combinations of units illustrated in FIG. 3, of which the operation is to be stopped in each power saving state, are an example. Modifications can be carried out thereto, depending on the configuration of the audio processing unit 15. Instead of stopping the operation of each unit in each power saving state to reduce the power consumption, the frequency of the clock signal supplied to each unit may be decreased, or the voltage of the supplied power may be decreased to reduce the power consumption.

Relationship Between Silence Section, Transition Time, and Restoration Time

Figure 4:
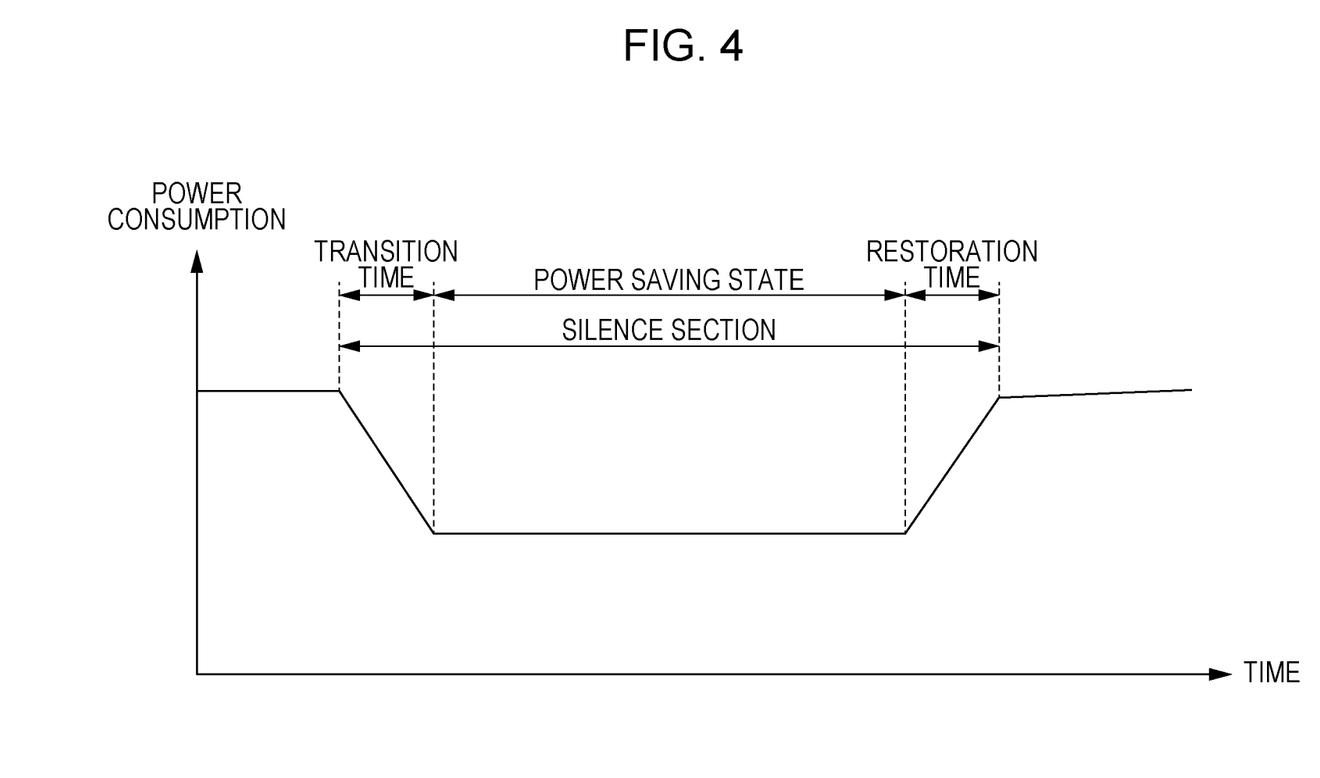
FIG. 4 is a diagram illustrating the relationship between a silence section, a transition time, and a restoration time.

FIG. 4 illustrates the relationship between a silence section in an audio signal, a transition time, and a restoration time. A transition time is a time necessary for a transition into a power saving state from the normal state. A restoration time is a time necessary for a restoration to the normal state from a power saving state. The sum of a transition time and a restoration time is shorter than the length of a silence section. A transition into a power saving state from the normal state starts at the start time of a silence section. A restoration to the normal state from a power saving state starts at a time obtained by subtracting a restoration time from the end time of a silence section. Accordingly, the restoration process can be completed until the end time of a silence section.

Power Saving Process by Information Processing Apparatus 10

Figure 5:
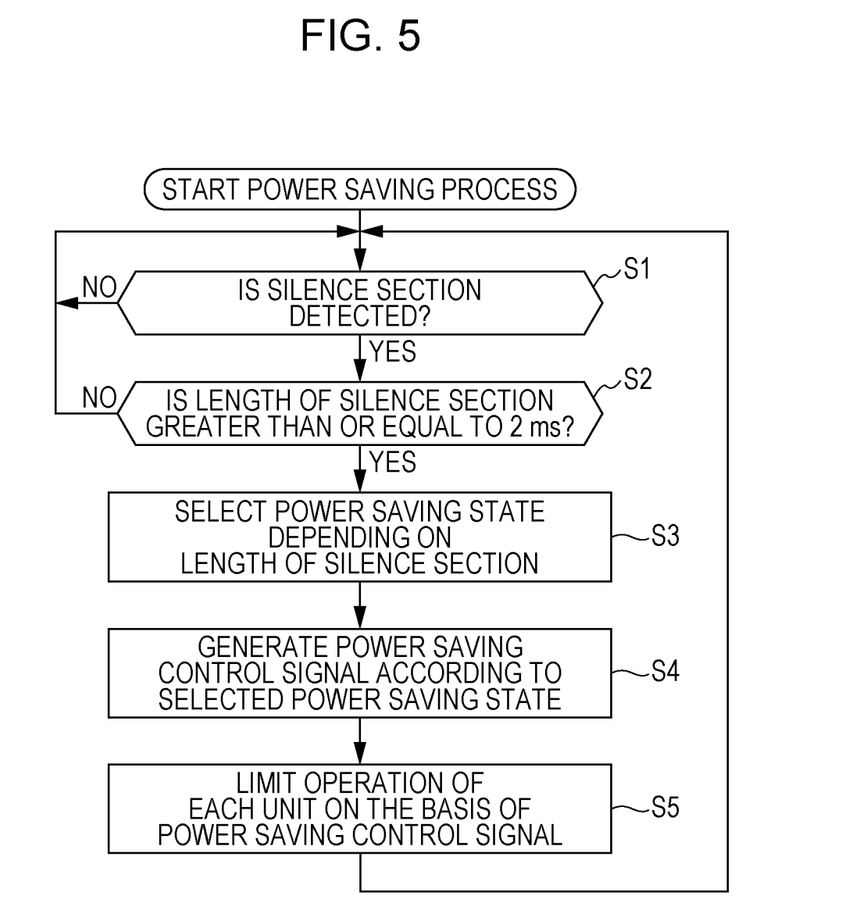
FIG. 5 is a flowchart describing a power saving process.

Next, FIG. 5 is a flowchart describing a power saving process by the information processing apparatus 10.

The power saving process is repeated for a period of time during which the information processing apparatus 10 processes (reproduces) an audio signal.

In step S1, the silence detecting unit 12 detects a silence section in an audio signal input from the input unit 11 and stands by until detecting a silence section (a process of reproducing a sound section in the audio signal is performed during this period of time). When a silence section is detected, the process proceeds to step S2.

In step S2, the silence detecting unit 12 determines whether the length of the time of the detected silence section (the length of the silence section) is greater than or equal to 2 ms. When the length of the silence section is determined not to be greater than or equal to 2 ms, the process returns to step S1 since a transition is not made into a power saving state. When the length of the silence section is determined to be greater than or equal to 2 ms, the process proceeds to step S3.

In step S3, the silence detecting unit 12 selects a power saving state to transition, depending on the length of the silence section. In step S4, the silence detecting unit 12 outputs to the signal control unit 13 the audio signal and the power saving control signal including the start time and the end time of the silence section and the selected power saving state.

In step S4, the signal control unit 13 outputs only the audio signal in a sound section to the audio processing unit 15 at a rear stage and outputs the power saving control signal input from the silence detecting unit 12 to the power source control unit 14. According to the power saving control signal, the power source control unit 14 performs the transition process for each unit in order to make a transition into the selected power saving state during the silence section by referring to the power saving state information that the power source control unit 14 holds in advance. Thereafter, the power source control unit 14 performs the restoration process for each unit. The process starts again from step S1 after the restoration process.

According to the power saving process described above, a transition is made into a power saving state in which the power consumption is further reduced as the length of the time of a silence section is longer, depending on the length of the time of the silence section in an audio signal. Thus, power saving can be realized efficiently. In addition, since a restoration time is also taken into consideration in a transition into a power saving state, power saving can be realized without exerting an influence such as a decrease in audio quality on processing (reproducing) a sound section subsequent to a silence section.

Figure 6:
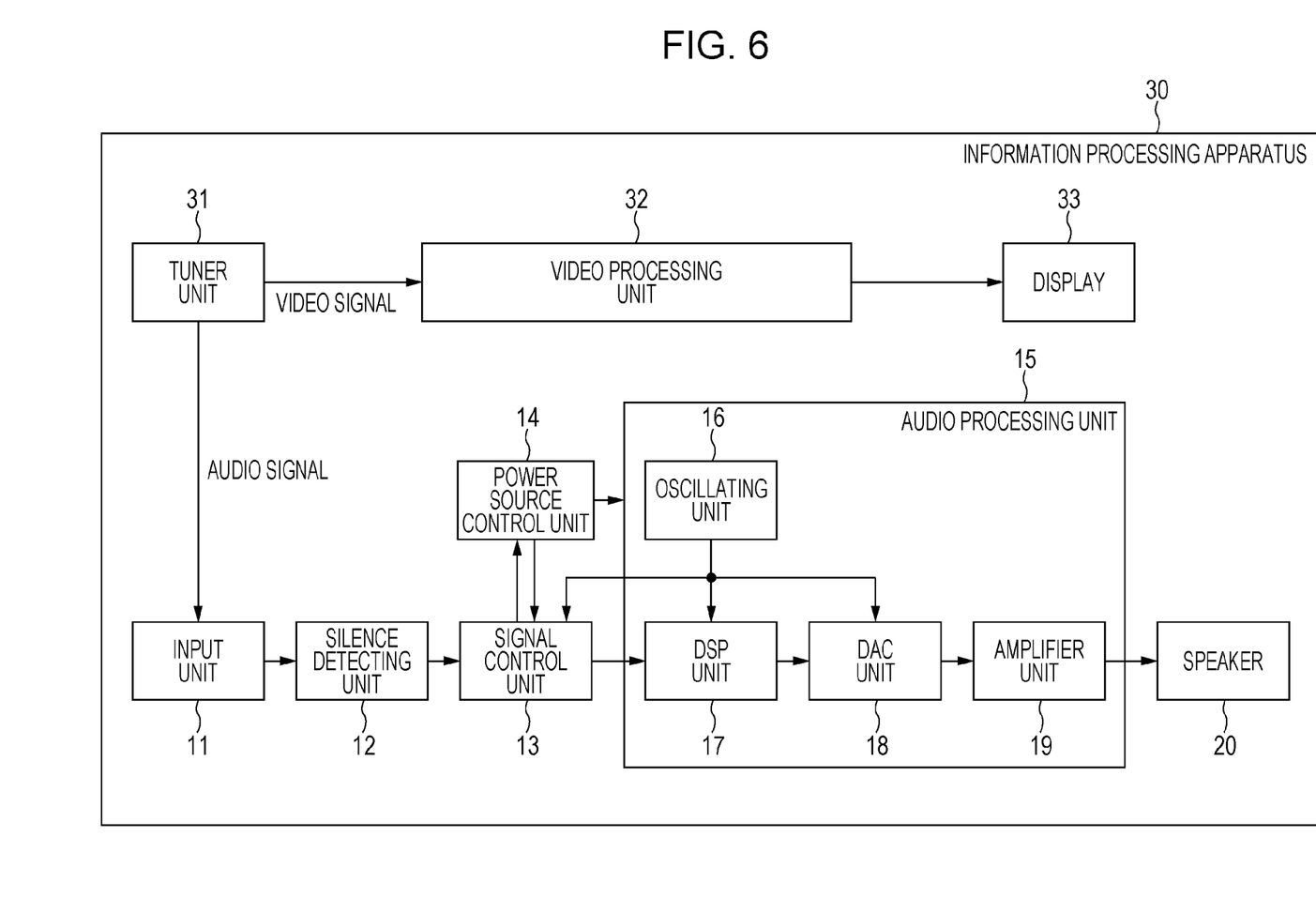
FIG. 6 is a block diagram illustrating another configuration example of the information processing apparatus to which an embodiment of the present disclosure is applied.

Another Configuration Example of Information Processing Apparatus of Present Embodiment FIG. 6 illustrates another configuration example of the information processing apparatus which is the present embodiment. An information processing apparatus 30 reproduces not only an audio signal but also a video signal as a process target. The information processing apparatus 30 can be applied to, for example, a television receiver. When detecting a silence section from an audio signal, the information processing apparatus 30 allows the audio processing unit to transition into one of a plurality of prepared power saving states, depending on the length of the silence section, thus reducing the power consumption and realizing power saving.

The information processing apparatus 30 is configured by adding a speaker 20, a tuner unit 31, a video processing unit 32, and a display 33 to the information processing apparatus 10 illustrated in FIG. 1. The tuner unit 31 separates an audio signal and a video signal from a received signal and supplies the audio signal to the input unit 11 and the video signal to the video processing unit 32. The video processing unit 32 performs a predetermined process for a video signal and displays on the display 33 a video based on the processed video signal. The constituents that are common to the information processing apparatus 10 are given the same reference signs, and descriptions thereof will be omitted.

The information processing apparatus 30, in a similar manner to the information processing apparatus 10 in FIG. 1, allows units related to an audio process to transition into one of a plurality of prepared power saving states, depending on the length of a silence section detected from an audio signal, thus reducing the power consumption and realizing power saving. The video processing unit 32 may transition into a power saving state, depending on the length of a silence section in an audio signal.

Figure 7:
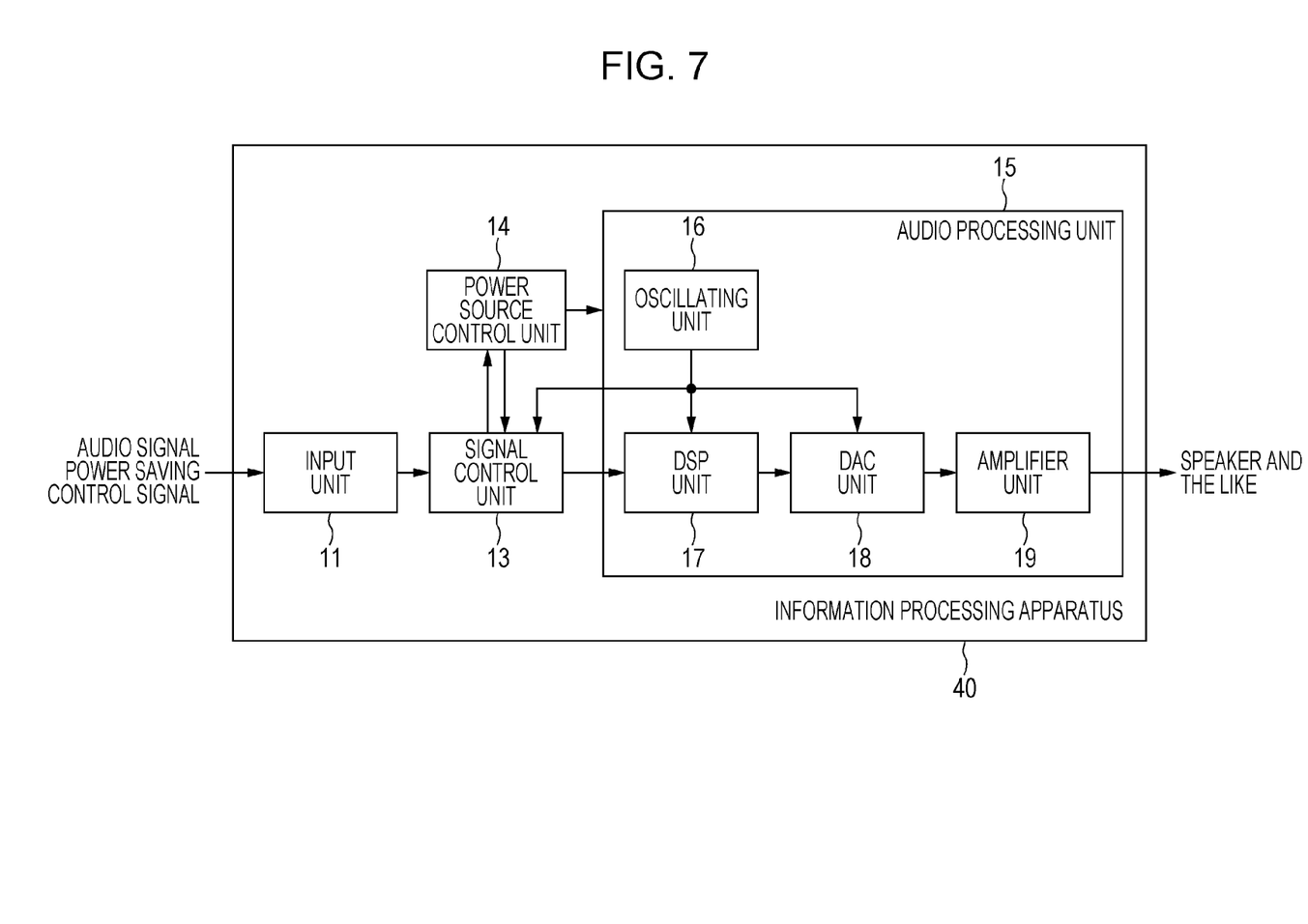
FIG. 7 is a block diagram illustrating still another configuration example of the information processing apparatus to which an embodiment of the present disclosure is applied.

Still Another Configuration Example of Information Processing Apparatus of Present Embodiment FIG. 7 illustrates still another configuration example of the information processing apparatus which is the present embodiment. An information processing apparatus 40 is configured by removing the silence detecting unit 12 from the information processing apparatus 10 illustrated in FIG. 1. Other constituents that are common to the information processing apparatus 10 are given the same reference signs, and descriptions thereof will be omitted.

An audio signal and the corresponding power saving control signal are input into the input unit 11 of the information processing apparatus 40. The power saving control signal includes the start time and the end time of a silence section and the selected power saving state in the same manner as that generated by the silence detecting unit 12 of the information processing apparatus 10 illustrated in FIG. 1. The information processing apparatus 40 can reduce the power consumption and realize power saving by transitioning into a power saving state during a silence section in an audio signal according to the power saving control signal.

The series of above-described processes that realize power saving can be performed by hardware or can be performed by software. When the series of processes is performed by a piece of software, a program constituting the piece of software is installed on a computer. The computer here includes a computer incorporated into a dedicated piece of hardware and, for example, a versatile personal computer that can perform various functions by various programs being installed thereon.

Figure 8:
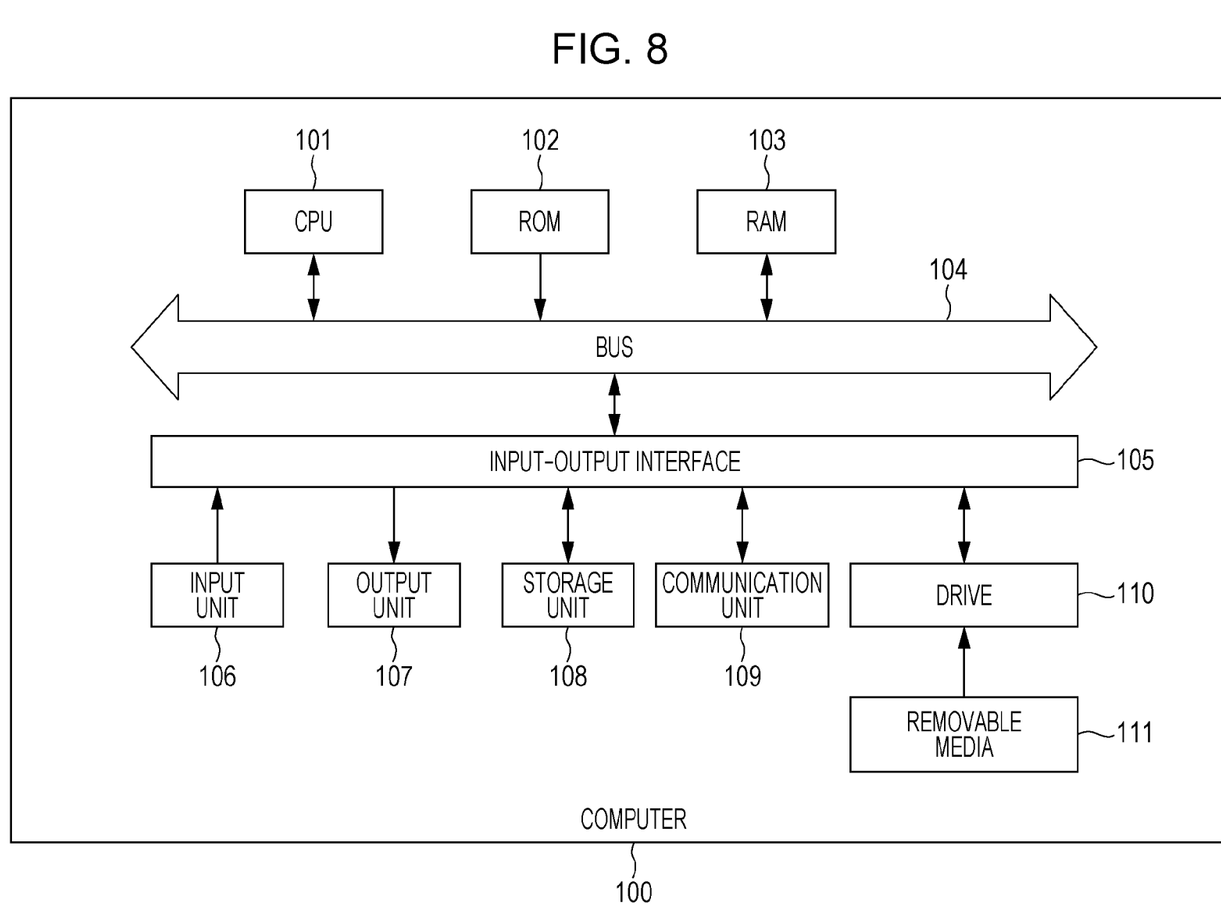
FIG. 8 is a block diagram illustrating a configuration example of a computer.

FIG. 8 is a block diagram illustrating a configuration example of the hardware of a computer that performs the series of above-described processes by a program.

A central processing unit (CPU) 101, a read-only memory (ROM) 102, and a random access memory (RAM) 103 are connected to each other through a bus 104 in a computer 100.

An input-output interface 105 is further connected to the bus 104. An input unit 106, an output unit 107, a storage unit 108, a communication unit 109, and a drive 110 are connected to the input-output interface 105. The input unit 106 is configured by a keyboard, a mouse, a microphone, and the like. The output unit 107 is configured by a display, a speaker, and the like. The storage unit 108 is configured by a hard disk, a non-volatile memory, or the like. The communication unit 109 is configured by a network interface and the like. The drive 110 drives removable media 111 such as a magnetic disk, an optical disc, a magneto-optical disk, and a semiconductor memory.

The series of the above-described processes is performed in the computer 100 configured as described above. For example, the CPU 101 loads a program stored on the storage unit 108 into the RAM 103 through the input-output interface 105 and the bus 104 and then executes the program.

The program that the computer 100 executes may be a program that performs processes in a time-series manner along the order described in the present specification. Alternatively, the program may be a program that performs processes in a parallel manner or at a necessary time such as when processes are called.

The embodiment of the present disclosure is not limited to the embodiment described above. Various modifications can be carried out to the embodiment without departing from the gist of the present disclosure.

The present disclosure can have the following configurations.

(1) An information processing apparatus including an audio processing unit that performs a predetermined process for an input audio signal, and a power saving control unit that allows the audio processing unit to transition into a power saving state, depending on the length of a silence section in the audio signal.

(2) The information processing apparatus according to (1), further including a silence detecting unit that detects a silence section in the input audio signal and generates a power saving control signal including the detection result, in which the power saving control unit allows the audio processing unit to transition into the power saving state according to the power saving control signal.

(3) The information processing apparatus according to (2), in which the silence detecting unit generates the power saving control signal that includes the start time and the end time of the detected silence section.

(4) The information processing apparatus according to (2) or (3), in which the silence detecting unit selects the power saving state among a plurality of power saving states, depending on the length of the detected silence section and generates the power saving control signal including the selection result.

(5) The information processing apparatus according to any one of (2) to (4), in which the silence detecting unit selects, among a plurality of power saving states, the power saving state in which the amount of reduction in power is great as the length of the detected silence section is longer and generates the power saving control signal including the selection result.

(6) The information processing apparatus according to any one of (1) and (5), in which the power saving control unit performs a transition process that allows the audio processing unit to transition into the power saving state from a normal state and a restoration process that restores the audio processing unit to the normal state from the power saving state during the silence section.

(7) The information processing apparatus according to (6), in which the silence detecting unit selects, among a plurality of power saving states, the power saving state in which a time necessary for the restoration process is long as the length of the detected silence section is longer and generates the power saving control signal including the selection result.

(8) A method for processing information in an information processing apparatus that includes an audio processing unit performing a predetermined process for an input audio signal, the method including power saving controlling, by the information processing apparatus, that allows the audio processing unit to transition into a power saving state, depending on the length of a silence section in the audio signal.

(9) A program that allows a computer to function as an audio processing unit that performs a predetermined process for an input audio signal, and a power saving control unit that allows the audio processing unit to transition into a power saving state, depending on the length of a silence section in the audio signal.

It should be understood by those skilled in the art that various modifications, combinations, sub-combinations and alterations may occur depending on design requirements and other factors insofar as they are within the scope of the appended claims or the equivalents thereof.

What is claimed is:

1. An information processing apparatus, comprising:
   an audio processing unit configured to process an input audio signal;
   a power saving control unit configured to allow the audio processing unit to transition into a power saving state, of a plurality of power saving states, based on a length of a silence section in the input audio signal; and
   a silence detecting unit configured to:
      detect the silence section in the input audio signal;
      select the power saving state, among the plurality of power saving states, based on the length of the detected silence section; and
      generate a power saving control signal including the selected power saving state,
         wherein the power saving control unit is configured to allow the audio processing unit to transition into the selected power saving state based on the generated power saving control signal.

2. The information processing apparatus according to claim 1,
wherein the silence detecting unit is further configured to generate the power saving control signal that includes a start time and an end time of the detected silence section.

3. The information processing apparatus according to claim 1,
wherein the silence detecting unit is further configured to:
select, among the plurality of power saving states, the power saving state based on an amount of reduction in power, wherein the amount of reduction in power indicates the length of the detected silence section; and
generate the power saving control signal including the selected power saving state.

4. The information processing apparatus according to claim 1,
wherein the power saving control unit is further configured to:
allow a transition of the audio processing unit into the power saving state from a normal states; and
restore a restoration process that restores the audio processing unit to the normal state, from the power saving state, during the silence section.

5. The information processing apparatus according to claim 4,
wherein the silence detecting unit is further configured to:
select, among the plurality of power saving states, the power saving state based on a time necessary for the restoration, wherein the time necessary for the restoration indicates the length of the detected silence section; and
generate the power saving control signal including the selected power saying state.

6. An information processing method, comprising:
detecting a silence section in an input audio signal;
selecting a power saying state, among a plurality of power saying states, based on a length of the detected silence section;
generating a power saying control signal including the selected power saying state; and
transitioning an audio processing unit into the selected power saying state based on the generated power saying control signal.

7. A non-transitory computer-readable storage medium having stored thereon a set of computer-executable instructions for causing a computer to perform operations, comprising:
detecting a silence section in an input audio signal;
selecting a power saying state, among a plurality of power saying states, based on a length of the detected silence section;
generating a power saying control signal including the selected power saying state; and
transitioning an audio processing unit into the selected power saying state based on the generated power saying control signal.

* * * * *